(12) United States Patent  
Awano

(10) Patent No.: US 7,755,115 B2  
(45) Date of Patent: Jul. 13, 2010

(54) FIELD EFFECT TRANSISTOR USING CARBON NANOTUBE OF TWO OR MORE WALLS HAVING THE OUTER WALLS AT THE GATE AND SOURCE/DRAIN REGIONS REMOVED

(75) Inventor: Yuji Awano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 36 days.

(21) Appl. No.: 12/202,770

(22) Filed: Sep. 2, 2008

(65) Prior Publication Data

US 2009/0072223 A1   Mar. 19, 2009

Related U.S. Application Data

(63) Continuation of application No. PCT/JP2006/304145, filed on Mar. 3, 2006.

(51) Int. Cl.  
*H01L 29/772* (2006.01)  
*H01L 21/335* (2006.01)

(52) U.S. Cl. .............. 257/288; 257/E21.411; 257/E29.07; 977/742; 977/752

(58) Field of Classification Search ................ 257/288; 977/742, 752  
See application file for complete search history.

(56) References Cited

U.S. PATENT DOCUMENTS

| | | | |
|---|---|---|---|
| 6,423,583 B1 * | 7/2002 | Avouris et al. | 438/132 |
| 7,180,107 B2 * | 2/2007 | Appenzeller et al. | 257/288 |
| 7,492,015 B2 * | 2/2009 | Chen et al. | 257/369 |
| 7,639,524 B2 * | 12/2009 | Kang et al. | 365/151 |
| 2002/0130333 A1 * | 9/2002 | Watanabe et al. | 257/200 |
| 2002/0163079 A1 | 11/2002 | Awano | |
| 2005/0051805 A1 | 3/2005 | Kim et al. | |
| 2006/0205105 A1 | 9/2006 | Maruyama et al. | |
| 2007/0048477 A1 * | 3/2007 | Oh | 428/36.92 |
| 2007/0187729 A1 * | 8/2007 | Park et al. | 257/288 |
| 2007/0228439 A1 * | 10/2007 | Duan et al. | 257/296 |
| 2008/0150165 A1 * | 6/2008 | Stumbo et al. | 257/784 |
| 2009/0201743 A1 * | 8/2009 | Yang | 365/185.28 |
| 2009/0224230 A1 * | 9/2009 | Pesetski et al. | 257/24 |

FOREIGN PATENT DOCUMENTS

| | | |
|---|---|---|
| JP | 2003-86796 A | 3/2003 |
| JP | 2004-171903 A | 6/2004 |
| JP | 2005-64452 A | 3/2005 |
| JP | 2005-116618 A | 4/2005 |
| WO | 02/063693 A1 | 8/2002 |

* cited by examiner

OTHER PUBLICATIONS

International Search Report of PCT/JP2006/304145, date of mailing May 30, 2006.

*Primary Examiner*—Anh D Mai  
(74) *Attorney, Agent, or Firm*—Westerman, Hattori, Daniels & Adrian, LLP

(57) ABSTRACT

A field effect transistor according to the present invention includes a carbon nanotube of two or more walls having an inner wall and an outer wall, source and drain electrodes formed on both sides of the carbon nanotube, and a gate electrode formed in a gate formation region of the carbon nanotube, wherein the outer wall of the carbon nanotube is removed in the gate formation region to expose the inner wall, an insulation film is formed on the exposed inner wall, the gate electrode is formed on the exposed inner wall via the insulation film or via a Schottky junction, the source and drain electrodes are formed in contact with the outer wall and inner wall, and the carbon nanotube between the source and drain electrodes and the insulation film is covered by the outer wall.

12 Claims, 4 Drawing Sheets

FIELD EFFECT TRANSISTOR USING CARBON NANOTUBE OF TWO OR MORE WALLS HAVING THE OUTER WALLS AT THE GATE AND SOURCE/DRAIN REGIONS REMOVED

CROSS REFERENCE TO RELATED APPLICATIONS

This application is a continuation of International Application No. PCT/JP 2006/304145, filed on Mar. 3, 2006, now pending, herein incorporated by reference.

TECHNICAL FIELD

The present invention relates to a field effect transistor that uses a carbon nanotube, a method of fabricating same and a sensor.

BACKGROUND

Electronic elements that employ a carbon nanotube (CNT) have been the subject of intense research. Carbon nanotubes are based on a structure obtained by rolling a graphene sheet with a hexagonal mesh-like structure of carbon atoms into a cylindrical shape, and single-wall carbon nanotubes and multi-wall carbon nanotubes exist. Carbon nanotubes can have a wide bandgap in the same way as semiconductors and can be an electron material that can be utilized in semiconductor devices. Although still at a basic research stage, a variety of application examples for electronic devices with carbon nanotubes have been reported.

For example, WO 02/063693A1 proposes a structure of electrodes electrically connected to a multi-wall carbon nanotube. Accordingly, the carbon nanotube is cut directly before forming the electrodes and metal with a strong chemical bond with carbon atoms is formed on a carbon nanotube obtained by cutting to form the electrodes. As a result, applications to electronic devices are attempted by reducing the contact resistance between the electrodes and the carbon nanotube.

In addition, Japanese Patent Laid-open Publication No. 2004-171903 proposes a field effect transistor in which a metallic inner wall of a double wall carbon nanotube is the gate electrode and a semiconductive outer wall is the channel. This Patent Document also discloses, as prior art, a field effect transistor in which a semiconductive inner wall of a double wall carbon nanotube is the channel region and a metallic outer wall is the gate electrode.

Generally, a field effect transistor having a carbon nanotube as the channel region possesses superior characteristics such as a long ballistic conduction length over which carriers move without scattering, a high-speed switching capability, and an improved high-frequency response characteristic.

However, because the diameter of a carbon nanotube is on the order of nm and extremely small, there is the problem that the innermost wall is readily affected by surface traps that are formed at the surface of the outermost wall. That is, the electrical conduction of the carbon nanotube is affected and the IV characteristic of the transistor has noise superposed thereon in accordance with the repetitive motion of the electrons between the traps formed by impurities that adhere to the surface of the outermost wall and the carbon nanotubes. Although forming a passivation film on the surface of the carbon nanotube may be considered, traps in the passivation film or at the interface between the film and the carbon nanotube cannot be completely dispensed with. The existence of such traps causes the loss of the superiority of the high-speed switching characteristic, the high-frequency characteristic and the low noise characteristic of a transistor that utilizes a carbon nanotube.

SUMMARY

According to an aspect of the present invention, a field effect transistor, includes a carbon nanotube of two or more walls having an inner wall and an outer wall, source and drain electrodes formed on both sides of the carbon nanotube, and a gate electrode formed in a gate formation region of the carbon nanotube, wherein the outer wall of the carbon nanotube is removed in the gate formation region to expose the inner wall, the gate electrode is formed over the exposed inner wall, and the carbon nanotube between the source and drain electrodes and the gate electrode is covered by the outer wall.

DETAILED DESCRIPTION OF THE PREFERRED EMBODIMENTS

Embodiment of the present invention will now be described with reference to the drawings. The technical scope of the present invention, however, shall not be limited to these embodiments, but extend to matters stated in the Claims and equivalents thereof.

A field effect transistor that utilizes a carbon nanotube permits a high-speed operation and a high current density operation or the like by utilizing a carbon nanotube for the channel. Utilizing a carbon nanotube first of all permits a long ballistic conduction length over which the carriers move without scattering and a higher average velocity for the carriers. That is, in the ballistic conduction, there is no action to mitigate the amount of motion caused by phonon scattering or impurity scattering or the like and the average velocity of the carriers increases. The maximum value of the carrier velocity reaches approximately 5 to $8 \times 10^7$ cm/s and is one digit higher than the carrier velocity within the inversion layer of a silicon-semiconductor MOS transistor. The production of such high-speed carriers is associated with improvements in the high-speed switching operation and in the high frequency response performance of the transistor. Secondly, because there are no problems caused by electromigration with a carbon nanotube, a high current density can be implemented and the current density can be expected from approximately 100 times to 1000 times greater than conventional metals. Thirdly, there are no substrate constraints. That is, although, where conventional semiconductor materials are concerned, a crystal substrate with minimal defects is required, a carbon nanotube can be of a material that is formed through self assembly and can be formed on any substrate using CVD or the like. The substrate can accordingly be a low-cost substrate. Fourthly, a one-dimensional channel structure is possible due to the extremely thin structure of the carbon nanotube and is suited to the formation of a short gate. That is, because it is possible to obtain a surround gate structure that surrounds the periphery of the one-dimensional channel structure, the short channel effect, which a FET with a conventional two-dimensional channel structure has, that is, an effect which causes the gate effect to weaken when the gate length grows short does not occur.

Thus, a field effect transistor that utilizes a carbon nanotube is capable of a high-speed operation and has a high frequency response performance, but is readily affected by surface traps due to the very thin structure of the carbon nanotube itself.

[Structure of the Field Effect Transistor]

Figure 1:
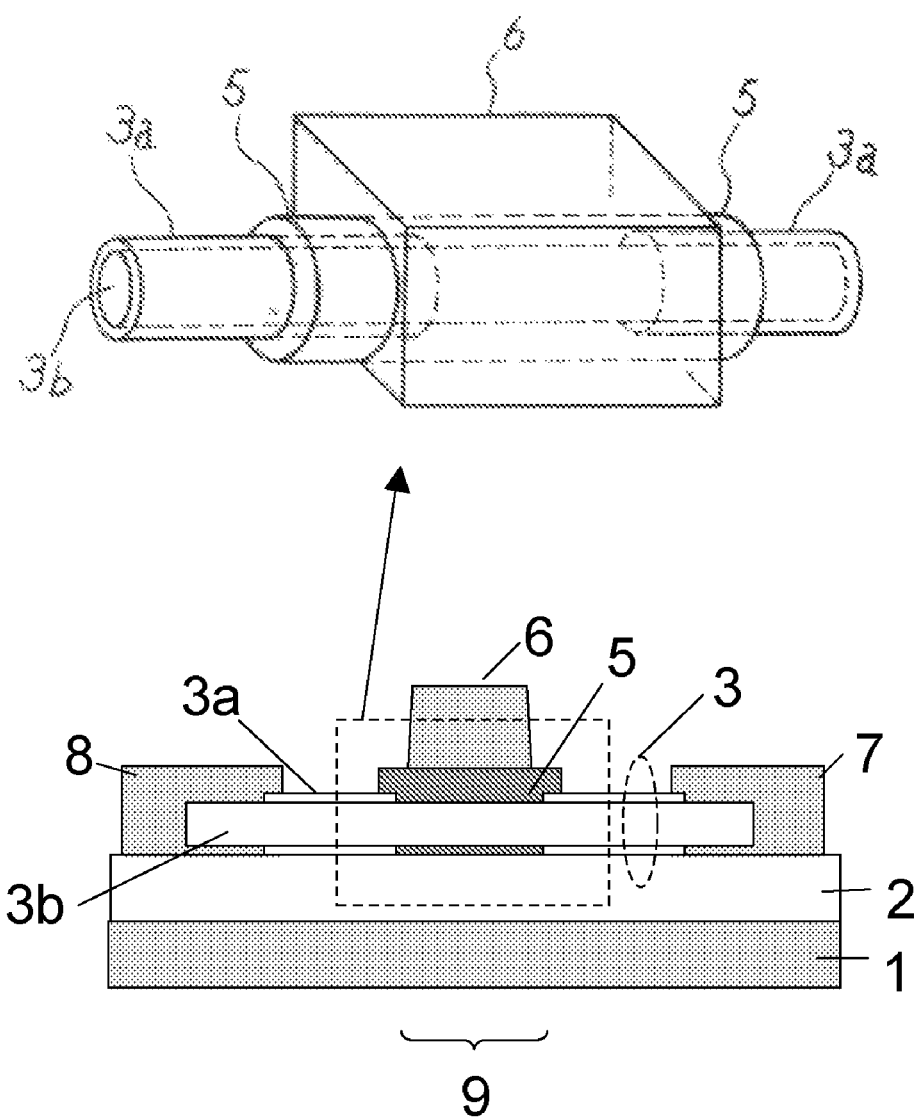
FIG. 1 is a constitutional view of the field effect transistor of this embodiment.

FIG. 1 is a constitutional view of the field effect transistor of this embodiment. FIG. 1 shows a cross-sectional view of the field effect transistor and an enlarged perspective view of the dashed line part of the cross-sectional view. As shown by this perspective diagram, the field effect transistor of this embodiment uses a multi-wall carbon nanotube 3 of two or more walls. The multi-wall carbon nanotube 3 uses a double wall nanotube (DWNT) which has an inner wall 3b consisting of a single wall and an outer wall 3a consisting of a single wall, for example, where either one or both of the inner and outer walls may also be multi-walls. The inner walls show the properties of semiconducting conduction. However, since when the number of walls of the carbon nanotube is increased, the bandgap narrows, thereby producing a semimetal, it is necessary to limit the number of walls to a small number which affords a wide bandgap whereby semiconductivity is obtained.

This embodiment is characterized in that the inner wall 3b of the DWNT 3 is used for the channel and the outer wall 3a is used for the passivation film. Further, the tube 3b of the inner wall is exposed by removing the outer wall 3a of the DWNT 3 in a gate electrode formation region 9 and a gate electrode 6 is formed on the exposed inner-wall tube 3b via a gate insulation film 5. That is, a stacked structure of the inner wall carbon nanotube 3b, gate insulation film 5, and gate electrode 6 is formed in the gate formation region 9. Furthermore, the outer wall 3a is partially removed on both sides of the DWNT 3, a source electrode 7 and a drain electrode 8 are formed on the outer wall 3a and on the exposed inner wall 3b, so that ohmic contact is formed. Therefore, the inner wall tube 3b constituting the channel is covered by the outer wall tube 3a between the source and drain electrodes 7 and 8 respectively and the gate electrode 6. Stated in more detail, the gate insulation film 5 covers a portion of the inner wall tube 3b exposed in the gate formation region 9 and of the outer wall tube 3a. The inner wall tube 3b is accordingly completely covered by the outer wall tube 3a and the gate insulation film 5.

The double wall carbon nanotube 3 is formed so that the outer wall 3a substantially completely encloses the inner wall 3b leaving equidistant (approximately 0.32 nm) spatial regions therebetween. Therefore, the outer wall tube 3a is an ideal passivation film for the inner wall tube 3b. As shown by the cross-sectional view, the inner wall tube 3b is completely covered by the outer wall 3a between the source and drain electrodes 7 and 8 respectively and the gate insulation film 5. Furthermore, since charge is present in the carbon nanotube and the carbon nanotube possesses semiconductive or metallic electrical conductivity, even when traps are formed at the surface of the outer wall tube 3a, the charge inside the outer wall tube 3a move and screened the charge of the traps. As a result, the traps have little effect on the charge moving within the inner wall tube 3b and have no effect on the electrical conductivity of the channel of the inner wall tube.

In addition, as shown by the cross-sectional view, the outer wall tube 3a exists in addition to the inner wall tube 3b constituting the channel between the source and drain electrodes 7 and 8 respectively and the effective channel directly below the gate electrode. The motion of the charge between the source and drain electrodes 7 and 8 and the effective channel region is possible in the outer wall tube 3a in addition to in the inner wall tube 3b. Hence, the source and drain resistances can be lowered. The charge that is injected from the source electrode moves to the inner wall tube by tunneling through the spatial regions while also moving within the outer wall tube. The charge similarly also moves from the effective channel to the drain electrode. Therefore, the parasitic resistance across the electrodes can be lowered due to the existence of the outer wall tube.

[Fabrication Method]

The field effect transistor fabrication method of this embodiment will be described next.

Figure 2A:
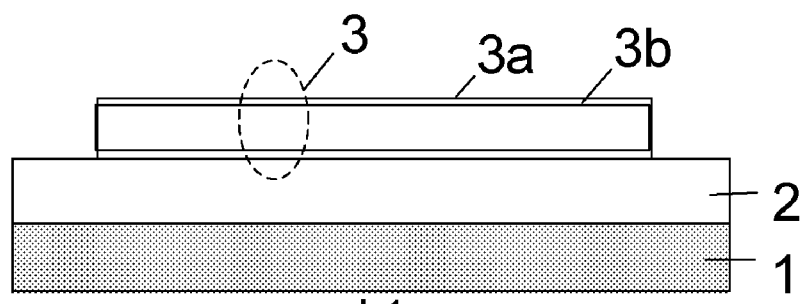
FIG. 2 is a cross-sectional views of the field effect transistor fabrication method.

FIGS. 2 and 3 are cross-sectional views of the field effect transistor fabrication method. As shown in FIG. 2A, an insulation film 2 such as a silicon oxide film is formed on the surface of the silicon substrate 2 and a double wall carbon nanotube (DWNT) 3 is formed on the insulation film 2. The formation of the DWNT 3 is carried out by means of a method that involves growing a DWNT using CVD that utilizes a catalytic metal, mixing the DWNT with an organic solvent, and spin-coating the resultant mixture to the surface of the substrate, for example. Alternatively, the formation of the DWNT 3 is performed by forming a catalytic metal of a transition metal material such as nickel, cobalt, or iron on the insulation film 2 or an alloy material containing these transition metal materials, patterning the catalytic metal to form the desired shape, and growing a DWNT on the catalytic metal by means of CVD using a growth gas (a hydrocarbon system or alcohol system). In this growth, a P-type semiconductive DMNT is formed. With the latter method, the desired number of DWNT can be formed in desired positions on the substrate and this method is suited to mass production. In the state of FIG. 2A, a DWNT 3 of a predetermined length is formed on the insulation film 2. The inner wall tube 3b and outer wall tube 3a of the DWNT 3 are grown as concentric cylinders spaced apart with a uniform spatial region therebetween.

Figure 2B:
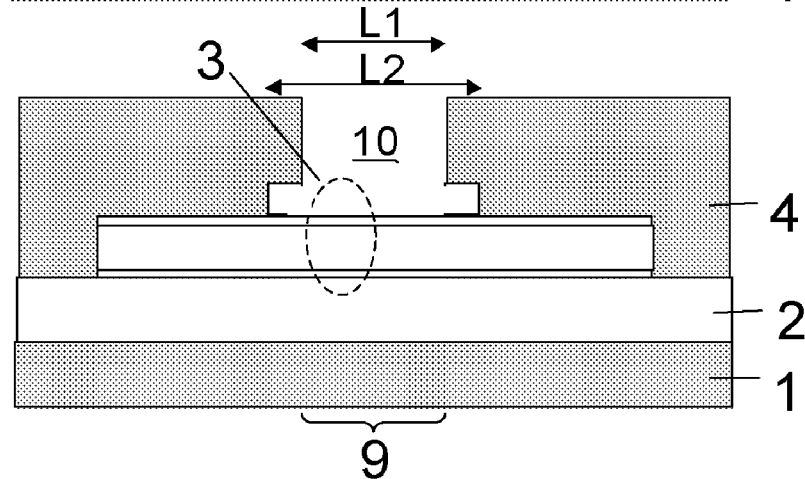

Thereafter, as shown in FIG. 2B, a resist layer 4 is coated on substrates 1 and 2 and DWNT 3 and subjected to exposure and development steps to form an opening 10 in the gate electrode formation region (or effective channel region) 9. The opening 10 is desirably an inverted T shape with a length L1 at the upper side of the resist layer 4 and a length L2 (>L1) at the lower side of the resist layer 4. The method for this purpose involves coating the lower-side resist layer and baking same under a first condition and coating the upper-side resist layer on the lower-side resist layer and baking same under a second condition that differs from the first condition. The resist layer is then exposed and developed by means of a mask pattern that corresponds with the gate electrode formation region 9. The two baking conditions are set so that, under the first baking condition, the exposure sensitivity is high and the post-development opening length L2 increases and, under the second baking condition, the exposure sensitivity is low and the post-development opening length L1 is smaller than L2.

Figure 2C:
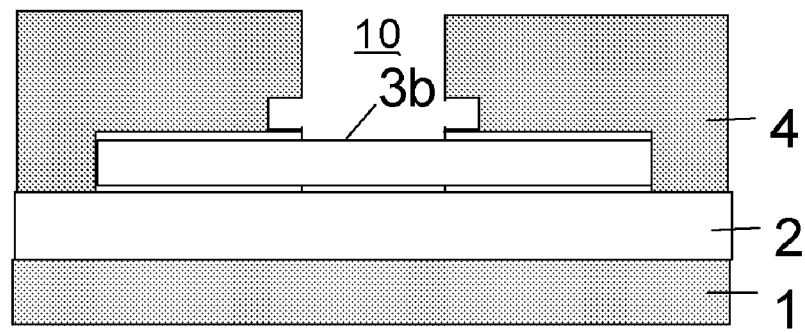

Thereafter, as shown in FIG. 2C, the outer wall tube 3a of the gate electrode formation region 9 of the DWNT 3 is removed using the resist layer 4 as the mask. In the patterning step, the outer wall tube 3a is removed by means of a weak oxidation process, for example, by irradiating the DWNT 3 via the opening 10 in the resist layer 4 with very ultra violet (VUV) rays in an ozone atmosphere. In addition, the outermost wall 3a may be removed only in a position which corresponds with the length L1 of opening 10 by establishing the abovementioned weak oxidation atmosphere while applying the voltage across the terminals of the DWNT 3 to 3 cause an overcurrent to flow. The inner wall tube 3b can be exposed in the gate electrode formation region 9 by means of this step. The inner wall tube 3b is desirably exposed over the entire periphery thereof.

Figure 3D:
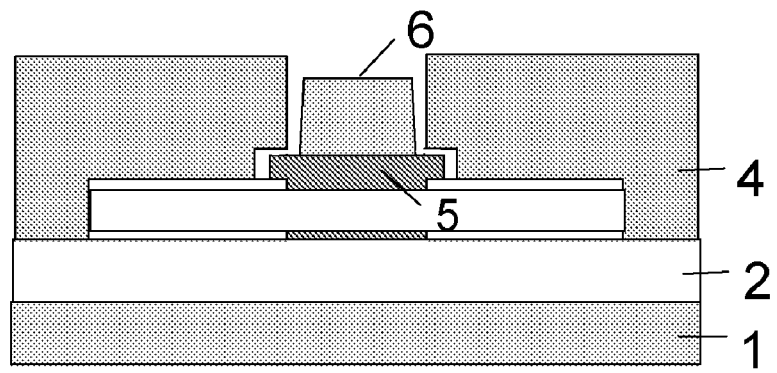
FIG. 3 is a cross-sectional views of the field effect transistor fabrication method.

Furthermore, as shown in FIG. 3D, the gate insulation film 5 using the resist layer 4 as a mask is formed to cover the whole of the inner wall tube 3b and a portion of the outer wall tube 3a. The method of forming the gate insulation film is CVD in which the growth gas is hafnium oxide, for example, where the film is formed thick enough that the tunneling phenomenon does not occur, with a film thickness of 3 to 5 nm, for example. With CVD, since the gate insulation film 5 is grown using the opening length L2 of the resist layer 4 as a mask, the gate insulation film 5 can be grown extending to a portion of the outer wall tube 3a. The gate insulation film 5 is desirably grown over the whole outer periphery of the exposed inner wall tube 3b.

In addition, the gate electrode 6 is formed on the gate insulation film 5 using the resist layer 4 as a mask. The method of forming the gate electrode 6 is carried out by means of sputtering with a metal such as tungsten, for example, and is formed with a film thickness of 500 nm, for example. Accordingly, the gate electrode 6 is formed using the opening length L1 of the resist layer as a mask and therefore the gate electrode can be formed on the exposed inner wall tube 3b by self-alignment. In addition, the gate electrode 6 is desirably formed over the whole outer periphery of the exposed inner wall tube 3b. However, this is not shown in FIG. 3D.

Figure 3E:
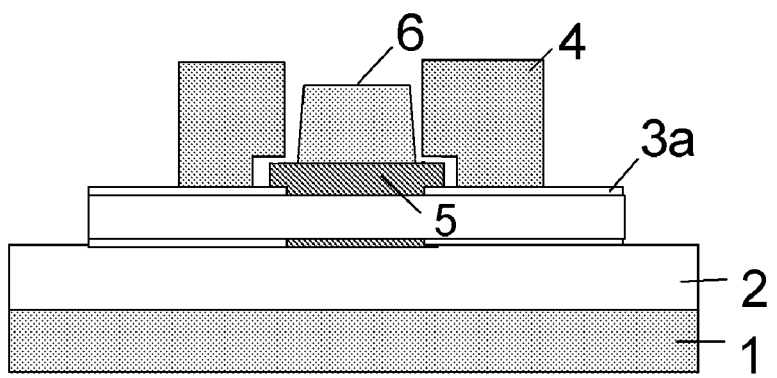
Figure 3F:
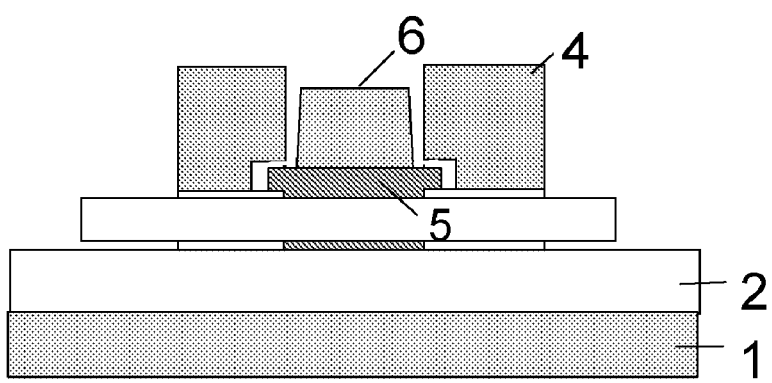

Thereafter, as shown in FIG. 3E, the resist layer 4 is patterned through exposure and development to expose the source electrode and drain electrode formation regions. As shown in FIG. 3F, the exposed outer wall tube 3a of the DWNT 3 is then removed by means of a weak oxidation process or the like to expose the inner wall tube 3b.

Figure 3G:
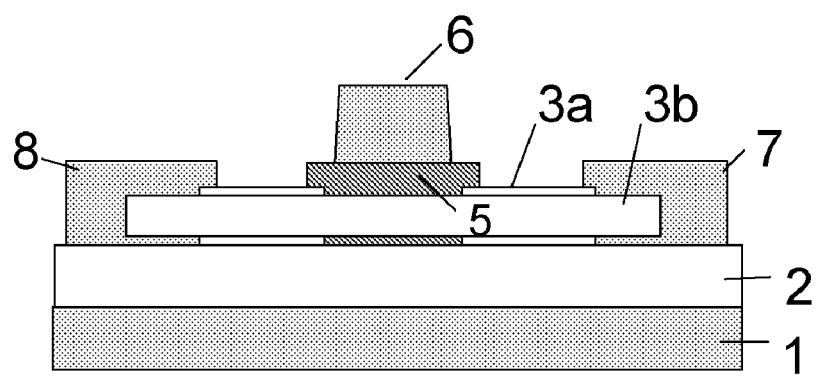

Finally, as shown in FIG. 3G, source electrode 7 and drain electrode 8 are formed on the inner wall tube 3b and outer wall tube 3a of the DWNT using the resist layer 4 as a mask. The source and drain electrodes 7 and 8 are formed with a film thickness of 500 nm, for example, by means of sputtering to form a stacked structure of titanium and a metal thereabove. Titanium carbide is formed as a result of a reaction between the titanium of the lower layer and the carbon of the DWNT, and ohmic contact is formed.

[Example of Schottky Gate]

In the above embodiment, a field effect transistor in which a gate electrode is formed on a channel via a gate insulation film was described. As a modified example thereof, an example in which the gate electrode is formed on the inner wall tube of the channel via a Schottky junction will be described.

Figure 4:
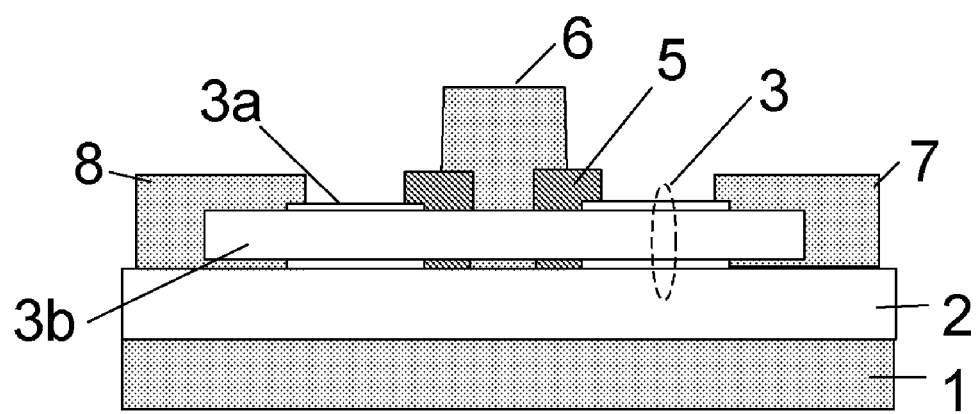
FIG. 4 is a structural cross-sectional view of the field effect transistor with a Schottky gate electrode structure.

FIG. 4 is a structural cross-sectional view of the field effect transistor with a Schottky gate electrode structure. This cross-sectional view differs from the cross-sectional view of FIG. 1 in that the inner wall tube 3b is exposed through the partial removal of the insulation film 5 and in that the gate electrode 6 is formed directly on the exposed inner wall tube 3b. The gate electrode 6 is, as mentioned earlier, a tungsten metal layer and a Schottky junction is formed at the interface with the inner wall tube 3b. Otherwise, the structure is the same as that of FIG. 1. Furthermore, the field effect transistor can be similarly fabricated by adding a patterning step of removing a portion of the insulation film 5 in FIG. 3D to the steps shown in FIGS. 2 and 3.

The outer wall tube 3a exists in the DWNT between the gate electrode 6 and the source and drain electrodes 7 and 8 also in the case of the Schottky electrode structure in FIG. 4 so as to protect the inner wall tube 3b of the channel as a passivation film. In addition, source and drain parasitic resistances can be reduced as a result of the presence of the outer wall tube. By forming the insulation film 5, a Schottky junction can be formed only between the gate electrode 6 and the inner wall tube 3b of the channel, whereby gate action can be occurred at the junction.

[Sensor]

Figure 5:
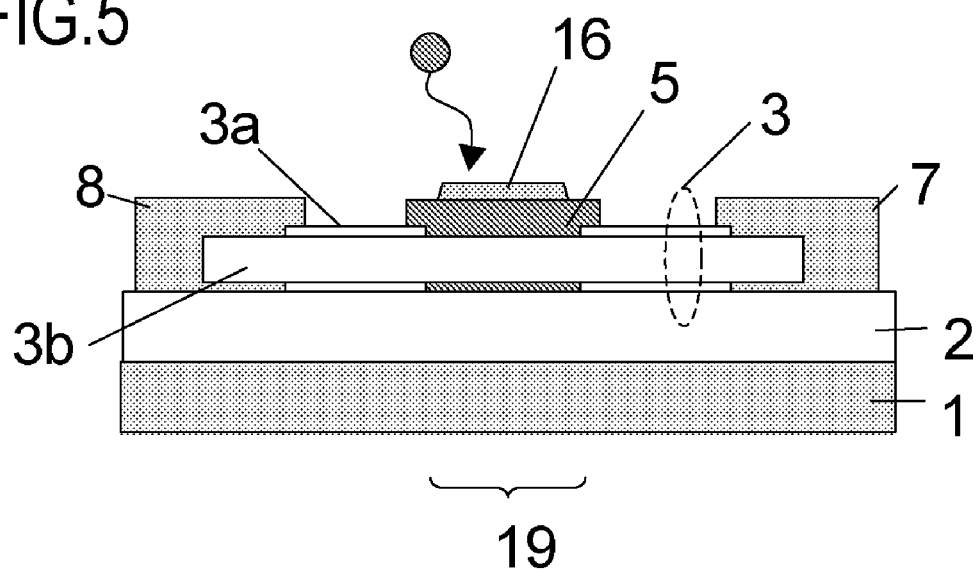
FIG. 5 is a cross-sectional view of the constitution of the sensor of this embodiment.

FIG. 5 is a cross-sectional view of the constitution of the sensor of this embodiment. The constitution of the sensor has an adsorption material layer 16 on the insulation film 5 that adsorbs a material to be detected, instead of the gate electrode 6 of the field effect transistor which has the gate insulation film of FIG. 1. The remaining constitution is the same as that of FIG. 1.

The adsorption material layer 16 is formed by coating an adsorption material to the surface of the insulation film 5 or directly to the inner wall 3b. For example, in cases where the hydrogen gas is the material to be detected, the adsorption material is platinum or palladium or the like. In addition, in cases where a specified biomaterial is the material to be detected, the adsorption material is a material which adsorbs the biomaterial. For example, the adsorption material is an antigen protein and the material to be detected is an antibody protein.

With such a sensor, when the material to be detected is adsorbed by the adsorption material 16, the amount of charge in the adsorption material 16 changes accordingly and this change induces a change in the electrical conductivity of the carbon nanotube 3 across the first and second electrodes 7 and 8 which is detectable as an electrical signal. With this sensor also, this embodiment makes it possible to suppress the effect of traps in the surface by utilizing the outer wall tube of the DWNT 3 as a passivation film and to raise the detection sensitivity.

Furthermore, although the above embodiment describes a double wall carbon nanotube by way of an example, the inner wall tube may have two or more walls as long as the carbon nanotube possesses semiconductivity or the outer wall tube may have two or more walls.

What we claimed is:

1. A field effect transistor, comprising:
   a carbon nanotube of two or more walls having an inner wall and an outer wall;
   source and drain electrodes formed on both sides of the carbon nanotube; and
   a gate electrode formed in a gate formation region of the carbon nanotube,
   wherein the outer wall of the carbon nanotube is removed in the gate formation region to expose the inner wall, the gate electrode is formed over the exposed inner wall, and the carbon nanotube between the source and drain electrodes and the gate electrode is covered by the outer wall.

2. The field effect transistor according to claim 1, wherein one or both of the inner wall and outer wall is or are a carbon nanotube wall of at least one layer.

3. The field effect transistor according to claim 1, wherein an insulation film that covers at least a portion or all of the exposed inner wall is formed.

4. The field effect transistor according to claim 3, wherein the gate electrode is formed on the insulation film and is electrically insulated from the outer wall and inner wall.

5. The field effect transistor according to claim 3, wherein a portion of the insulation film is removed in the gate formation region to expose the inner wall and the gate electrode is formed via a Schottky junction on the inner wall on which a portion of the insulation film is removed.

6. The field effect transistor according to claim 1, wherein an insulation film that covers at least a portion or all of the exposed inner wall and extends over the outer wall is formed.

7. The field effect transistor according to claim 6, wherein the gate electrode is formed on the insulation film and is electrically insulated from the outer wall and inner wall.

8. The field effect transistor according to claim 6, wherein a portion of the insulation film is removed in the gate formation region to expose the inner wall and the gate electrode is formed via a Schottky junction on the inner wall on which a portion of the insulation film is removed.

9. The field effect transistor according to claim 1, wherein the source and drain electrodes are connected to the inner wall and outer wall.

10. The field effect transistor according to claim 1, wherein in the gate formation region, the outer wall is removed over the whole periphery of the carbon nanotube and the gate electrode is formed over the whole periphery of the exposed inner wall.

11. A field effect transistor, comprising:
a carbon nanotube of two or more walls having an inner wall and an outer wall;
source and drain electrodes formed on both sides of the carbon nanotube; and
a gate electrode formed in a gate formation region of the carbon nanotube,
wherein the outer wall of the carbon nanotube is removed in the gate formation region to expose the inner wall, an insulation film is formed on the exposed inner wall, the gate electrode is formed over the exposed inner wall via the insulation film or via a Schottky junction, the source and drain electrodes are formed in contact with the outer wall and inner wall, and the carbon nanotube between the source and drain electrodes and the insulation film is covered by the outer wall.

12. The field effect transistor according to claim 11, wherein one or both of the inner wall and outer wall is or are a carbon nanotube wall of at least one layer.

* * * * *